United States Patent [19]

Hanawa et al.

[11] Patent Number: 4,745,302
[45] Date of Patent: May 17, 1988

[54] ASYNCHRONOUS SIGNAL SYNCHRONIZING CIRCUIT

[75] Inventors: Makoto Hanawa; Kouki Noguchi, both of Kokubunji; Osamu Shinbo, Musashino, all of Japan

[73] Assignees: Hitachi, Ltd.; Hitachi Micro Computer Engineering, Ltd., both of Tokyo, Japan

[21] Appl. No.: 812,349

[22] Filed: Dec. 23, 1985

[51] Int. Cl.[4] .................. H03K 13/03; H03K 5/00
[52] U.S. Cl. .................. 307/269; 307/262; 307/480; 328/63; 328/72; 377/78
[58] Field of Search ............... 307/269, 480, 481, 262; 328/63, 72, 109; 377/66, 78, 80; 375/104, 118

[56] References Cited

U.S. PATENT DOCUMENTS 3,916,223 10/1975 Felte et al. ..................... 307/261
4,349,873 9/1982 Gunter et al. .................. 364/200
4,396,905 8/1983 Chan et al. .................... 340/347 AD

FOREIGN PATENT DOCUMENTS 0005621 1/1985 Japan .

Primary Examiner—Stanley D. Miller
Assistant Examiner—Richard Roseen
Attorney, Agent, or Firm—Kenyon & Kenyon

[57] ABSTRACT

An asynchronous signal synchronizing circuit for sampling and external asynchronous signal in a quarter of the period of a clock. A first latch circuit latches asynchronous input signal in accordance with a first clock, and a second latch circuit latches the output of the first latch circuit in accordance with a second clock having a phase shift 180° out of phase with the first clock. A third latch circuit latches the output signal of the second latch signal in accordance with a clock signal that represents the inverse of the first clock. A fourth latch circuit latches the output signal of the third latch circuit under the control of a clock that corresponds to the inverse of the second clock. The asynchronous input signal is sampled at the tailing edge of the first clock signal and validated by the tailing edge of the second clock signal. The synchronization of the asynchronous signal can thus be performed in a quarter of a clock cycle.

7 Claims, 3 Drawing Sheets

ASYNCHRONOUS SIGNAL SYNCHRONIZING CIRCUIT

The present invention relates to a circuit for synchronizing an input signal which changes without being synchronous to a clock.

In recent years, the operating speed of logic LSI, such as microprocessors has risen. Now, a logic LSI adapted to operate at a clock frequency of 10 odd or several tens of MHz has appeared, and the signal delay time in the LSI has been shortened to approximately 1 ns. On the other hand, a signal delay time outside the LSI has reached on the order of several tens ns though packaging techniques. In the internal circuit of the LSI, accordingly, it has become difficult to synchronously perform the transmission and reception of signals outside the LSI. Therefore, the input signal from outside the LSI is inevitably handled as an asynchronous signal, and an asynchronous signal synchronizing circuit is required as the signal input circuit of the LSI.

In general, an asynchronous signal can be sampled using a shift register of two stages which are controlled by a clock $\phi 1$ and an inverted signal $\bar{\phi}1$ shifted in phase by 180° from the former. However, the output of a flip-flop at the second stage is unstable at the leading edge of the clock $\bar{\phi}1$. In this regard, by latching the output signal again with a clock lagging $\bar{\phi}1$, a signal which is valid completely during 1 machine cycle can be produced. Heretofore, $\phi 1$ shifted in phase by 180° has been employed as the clock lagging $\bar{\phi}1$. An example thereof is shown in FIG. 11 of U.S. Pat. No. 4,349,873.

The circuit of FIG. 11 of U.S. Pat. No. 4,349,873 is illustrated in FIG. 1. This circuit is such that three latch circuits 1, 2 and 3 are connected in series, among which the latch circuits 1 and 3 are controlled by the clock signal $\phi 1$, while the latch circuit 2 is controlled by the clock signal $\bar{\phi}1$.

The clock signals $\phi 1$ and $\bar{\phi}1$ are signals which have the relationship of inversion from each other. Accordingly, a half clock cycle after the sampling of the external signal is required before a synchronized signal is obtained from the latch circuit 3.

SUMMARY OF THE INVENTION

A first object of the present invention is to provide an asynchronous signal synchronizing circuit of high speed in which the period of time from the sampling of an external signal until the settling of an internal signal is shortened without raising a clock frequency.

A second object of the present invention is to provide an asynchronous signal synchronizing circuit which is arranged so as not to output an intermediate value (a value not settled to be "high" or "low") when an asynchronous signal is synchronized.

In order to accomplish the first object, the present invention uses a new clock $\phi 2$ having a phase shift of below 180° from a clock $\phi 1$ and comprises a first latch circuit which latches an asynchronous input signal in accordance with the clock $\phi 1$, a second latch circuit which latches an output signal of the first latch circuit in accordance with the clock $\phi 2$, a third latch circuit which latches an output signal of the second latch circuit in accordance with an inverted signal of the clock $\phi 1$, and a fourth latch circuit which latches an output signal of the third latch circuit in accordance with an inverted signal of the clock $\phi 2$. Namely, the new clock $\phi 2$ is a clock having a period that is synchronized between the period of the first clock and the inverted clock of the first clock. Thus, a synchronized signal can be quickly derived without raising the clock frequency.

In order to accomplish the second object, the present invention adds a latch to be controlled by a clock $\phi 2$, between latches of clocks $\phi 1$ and $\bar{\phi}1$ and constructs a feedback loop in the two latches of the clocks $\phi 1$ and $\phi 2$ before the settling of an internal signal by a clock $\bar{\phi}2$, thereby to prevent the latch of an intermediate value. More specifically, the intermediate value which might be held in each the feedback loop of each latch is a value inherent depending upon the logical threshold values of gates which constitute the loop, and when a signal deviating from this value has been input, an output signal is infallibly rendered logical "0" or "1". Therefore, the intermediate values of the asynchronous signal can be prevented from being latched in such a way that the intermediate values which might be held in respective feedback loops are set at unequal values beforehand.

DESCRIPTION OF THE PREFERRED EMBODIMENT

Now, one embodiment of the present invention will be described with reference to the drawings.

Figure 1:
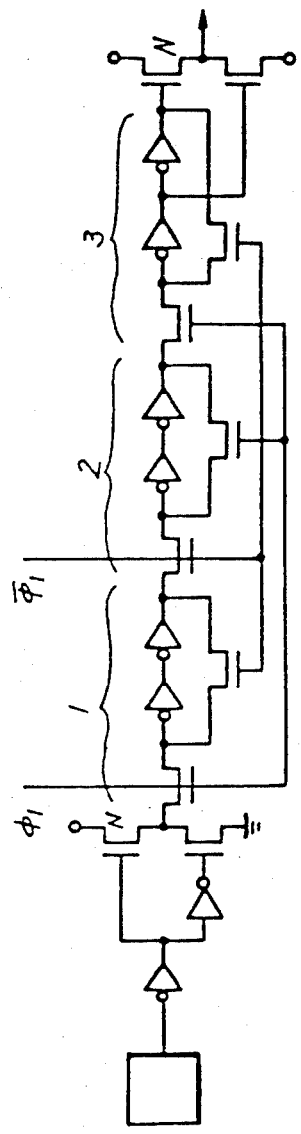
FIG. 1 is a diagram showing a prior-art synchronizing circuit.
Figure 2:
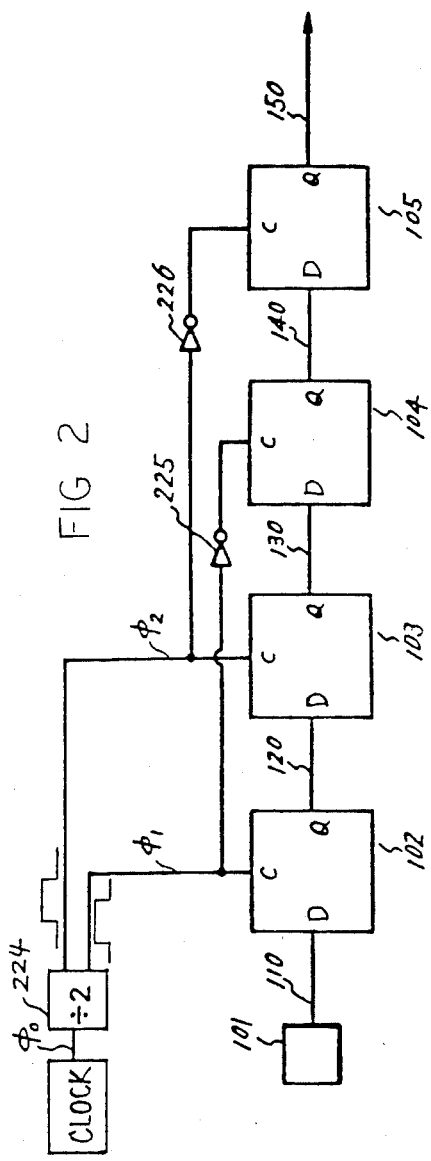
FIG. 2 is a block diagram of an embodiment of an asynchronous signal synchronizing circuit according to the present invention.
Figure 3:
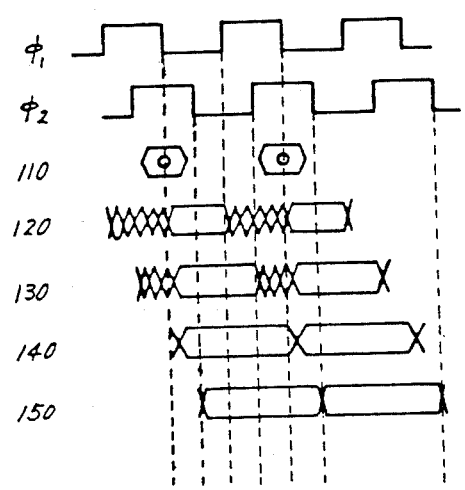
FIG. 3 is a timing diagram for the asynchronous signal synchronizing circuit of FIG. 2.

FIG. 2 is a block diagram of a synchronizing circuit for an asynchronous signal to which the present invention is applied. Flip-flops 102–105 are latch circuits each of which transmits input data D to an output terminal Q when a control signal input C is asserted, i.e., at a first logic level and holds and delivers an output signal Q when the same is negated, i.e. is at the other logic level. Each of circuits elements 225 and 226 is an inverter. The operation of the asynchronous signal synchronizing circuit will be described with reference to the timing diagram of FIGS. 2 and 3. An input signal 110 applied from the input terminal 101 of an LSI chip is latched by the flip-flop 102 when a timing clock $\phi 1$ goes "low", whereupon a signal 120 is output. The flip-flop 102 passes the input signal 110 while the clock $\phi 1$ is "high", so that the output value 120 during this period varies depending upon the input signal 110 and is indefinite. The signal 120 is then latched by the flip-flop 103 in accordance with a timing clock $\phi 2$ which is shifted in phase by 90° from the clock $\phi 1$, whereupon a signal 130 is output. An output signal 140 produced by latching the signal 130 in accordance with the inverted signal of the clock $\phi 1$ becomes a signal which holds a value during one cycle of the clock $\phi 1$ as shown in the timing diagram. However, the signal 140 is unstable at the tailing edge of the clock $\phi 1$. The reason is that, since gate delays are involved in the flip-flops 103 and 104 at the second and third stages, a time interval is required until the settling of the signal 140 even when the signal 120 has been settled at the tailing edge of the clock $\phi 1$.

Therefore, when the signal 140 is latched again in accordance with the inverted signal of the clock $\phi 2$; the resulting output signal 150 holds a value during one cycle of the clock $\phi 2$ and affords a value valid from the tailing edge of the clock $\phi 2$ as illustrated in the timing diagram.

Figure 4:
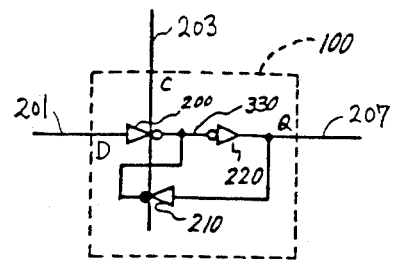
FIG. 4 is the logic diagram of a flip-flop which is employed in the circuit of FIG. 2.

FIG. 4 shows an example of arrangement of each of the flip-flops 102–105. A logic gate 200 outputs on line 330 the inverted signal of the input signal D on line 201 when the control signal C on line 203 is asserted, i.e., a "high" signal, and no signal when the same is negated because the logic gate 200 becomes a high impedance state. To the contrary a logic gate 210 outputs the inverted signal of the output signal Q of the flip-flop on line 207 when the control signal C is negated, and no signal when the same is asserted because the logic gate 210 becomes a high impedance state. When the two sorts of logic gates 200 and 210 and an inverter 220 are connected as shown in FIG. 4, a flip-flop which latches the input data D in accordance with the control signal C results.

As explained above, with the present embodiment, the asynchronous signal is sampled at the tailing edge of the clock $\phi 1$, and the internal signal can be validated at the tailing edge of the clock $\phi 2$. That is, the synchronization of the asynchronous signal can be done in a time interval of ¼ of a clock cycle. Here, the clocks $\phi 1$ and $\phi 2$ whose phases shift by 90° can be readily generated in such a way that a parent clock $\phi_o$ having a frequency double higher is divided by 2 in a divider 224.

Therefore, the illustrated embodiment is well suited for use as a synchronizing input for the response signal, interrupt request signal etc. of an asynchronous transfer bus.

Next, an arrangement which prevents the asynchronous signal synchronizing circuit from outputting an intermediate value will be explained.

Figure 5:
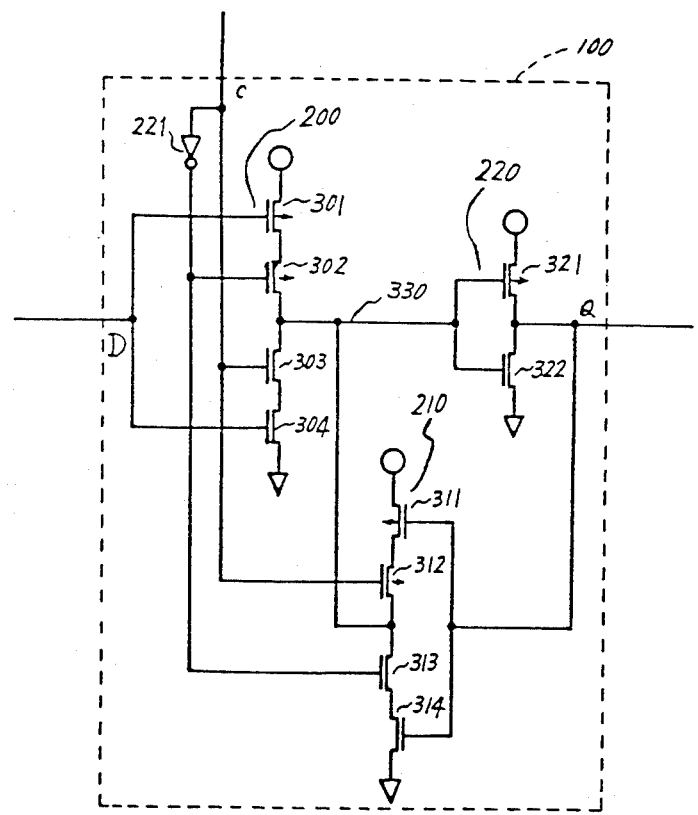
FIG. 5 is a detailed circuit diagram of the flip-flop of FIG. 4.

FIG. 5 shows an example of the more detailed circuit arrangement of the flip-flop. Circuit elements 301, 302, 311, 312, and 321 are P-channel MOSFETs, while circuit elements 303, 304, 313, 314 and 322 are N-channel MOSFETs. The MOSFETs 301, 302 303 and 304 that are connected in series constitute the logic gate 200 in FIG. 4, while the MOSFETs 311, 312, 313 and 314 similarly constitute the logic gate 210. The MOSFETs 301, 304, 311 and 314 are arranged outside of the respective series and the MOSFETs 302, 303, 312 and 313 are arranged inside. A circuit element 221 is an inverter. In addition, the MOSFETs 321 and 322 constitute the inverter 220. The operation of the flip-flop will be described with reference to FIG. 5. First, when the control signal C is asserted (rendered "high"), the circuit elements 302 and 303 fall into ON states, and the logic gate 200 effects the same function as that of an inverter and outputs the inverted signal of the input signal D. On the other hand, the logic gate 210 outputs no signal because the circuit elements 312 and 313 are in OFF states. Accordingly, a signal line 330 becomes the inverted signal of the input signal D, and the inverter 220 inverts it again and transmits the input signal D to the output terminal Q.

Next, when the control signal C is negated (rendered "low"), the logic gate 200 outputs no signal because the circuit elements 302 and 303 fall into OFF states. On the other hand, the circuit elements 312 and 313 fall into ON states, and the logic gate 210 effects the same function as that of an inverter and outputs the inverted signal of the output signal Q. Accordingly, the signal line 330 comes to have the inverted signal of the output signal Q, and is inverted again by the inverter 220, whereby the output signal Q is provided, and the value is held.

When, in this flip-flop, the gate width of the P-MOSFET 311 of the logic gate 210 is made greater than in an ordinary case, the logical threshold level of the logic gate 210 becomes higher. Accordingly, in the case where the control signal C is negated to latch the intermediate value in the feedback loop constructed of the logic gate 210 and the inverter 220, the value of the output signal Q at the input of the logic gate 210 becomes stable at a level which is higher than with the ordinary gate width of the P-MOSFET 311. That is, when a value somewhat higher than an ordinary one has been given as the input signal D with the control signal C asserted, this flip-flop latches the intermediate value and its output signal Q becomes a level higher than an ordinary one. Conversely, when the gate width of the N-MOSFET 314 of the logic gate 210 is enlarged, the logical threshold level of the logic gate 210 lowers. Accordingly, when the intermediate value is latched in the feedback loop, the value of the output signal Q becomes a lower level. That is, when a value somewhat lower than an ordinary one has been input with the control signal C asserted, this flip-flop latches the intermediate value, and its output signal Q becomes a level lower than an ordinary one.

In a case where the flip-flop has latched a value other than the intermediate value, the output signal Q is amplified to the perfectly high or low level owing to the feedback loop which is constructed of the logic gate 210 and the inverter 220.

When, in the asynchronous signal synchronizing circuit of FIG. 2, the flip-flop with the gate width of the P-MOSFET 311 enlarged is employed as the first-stage flip-flop 102 for latching the input signal 110 and the flip-flop with the gate width of the N-MOSFET 314 enlarged is employed as the second-stage flip-flop 103 for latching the output signal 120, the intermediate value can be amplified to the high or low level without fail, because even when the first-stage flip-flop 102 has latched the intermediate value, the output signal 120 at that time becomes the level somewhat higher than the intermediate value which is produced by the ordinary flip-flop, it can be settled to the perfectly high level by the second-stage flip-flop 103. The intermediate value is latched in the second-stage latch 103 in a case where a somewhat lower intermediate value is received as the input signal 120. However, the intermediate value becomes a somewhat higher level in the first-stage flip-flop 102 which is delivering the signal 120, and any other value is settled to the perfectly high or low level by the feedback loop. Therefore, the somewhat lower intermediate value is not delivered as the signal 120.

Accordingly, the logical threshold values of the gates constituting the respective flip-flops are controlled so that the value to be output when the first-stage flip-flop 102 has latched the intermediate value may differ from the value to be input when the second-stage flip-flop 103 latches the intermediate value, whereby when the first- and second-stage flip-flops 102 and 103 fall into the feedback states, the output signal 130 can be settled to the perfectly high or low level. The output signal 150 in FIG. 2 transmits the signal 140 to the output when the clock $\phi 2$ has been negated. More specifically, the output signal 150 is delivered after the first- and second-stage latches 102 and 103 have fallen into the feedback stages, so that it can provide a value perfectly settled to the high or low level.

While, in the above description, the sizes of the MOSFETs of the logic gate 210 have been altered in order to control the intermediate value which the flip-flop might latch, the sizes of the MOSFETs of the logic gate 200 or the inverter 220 may be altered alternatively.

The present invention produces the effect that a time interval from the sampling of an asynchronous signal until the settlement of a synchronized signal can be shortened without raising the frequency of an internal clock for sampling.

Another effect is that, by making a first-stage latch and a second-stage latch a feedback type and by controlling intermediate values, which might be latched, to unequal values, a signal perfectly settled to a high or low level can be derived as the synchronized signal of an asynchronous signal.

What is claimed is:

1. An asynchronous signal synchronizing circuit comprising:

means for generating first and second clock signals of equal frequency but shifted in phase as well as third and fourth clock signals of equal frequency but shifted in phase such that said third clock signal has a frequency substantially equal to that of said first clock signal as well as a phase substantially opposite to that of said first clock signal, said fourth clock signal has a frequency substantially equal to that of said second clock signal as well as a phase substantially opposite to that of said second clock signal:

a first latch circuit having as an input an asynchronous signal to be synchronized, means for transmitting said asynchronous signal from said input to an output of said first latch circuit in response to either a high level or a low level of said first clock signal, and means for latching said output of said first latch circuit in response to either of said high level or said low level of said first clock signal;

a second latch circuit having said output signal of said first latch circuit as an input, means for transmitting said output signal of said first latch circuit from said input to an output of said second latch circuit in response to either a high level or a low level of said second clock signal, and means for latching said output of said second latch circuit in response to either of said high level or said low level of said second clock signal;

a third latch circuit having said output signal of said second latch circuit as an input, means for transmitting said output signal of said second latch circuit from said input to an output of said third latch circuit in response to either a high level or a low level of said third clock signal, and means for latching said output of said third latch circuit in response to either of said high level or said low level of said third clock signal; and a fourth latch circuit having said output signal of said third latch circuit as an input, means for transmitting said output signal of said third latch circuit from said input to an output of said fourth latch circuit in response to either a high level or a low level of said fourth clock signal, and means for latching said output of said fourth latch circuit in response to either of said high level or said low level of said fourth clock signal.

2. An asynchronous signal synchronizing circuit according to claim 1, wherein each of said latch circuits comprises:

a first logic gate having as its signal input the input to said latch circuit and when enabled by receiving any one of said high level or said low level of one of said first, second, third or fourth clock signals providing an output which is an inverse of its input:

a first inverter having the output of said first logic gate as an input and having as its output the latch output; and a second logic gate having the output of said first inverter as a signal input and having its output coupled to the input of said first inverter, and when enabled by receiving any of said high level and said low level of said one of said first, second, third or fourth clock signals providing the output of the second logic gate which is the inverse of its input.

3. An asynchronous signal synchronizing circuit according to claim 2, wherein:

said first logic gate comprise: first and second P-channel MOSFETs connected in series and first and second N-channel MOSFETs connected in series with said second P-channel and second N-channel MOSFETs also connected in series, the input of said first logic gate coupled to the gates of said first P-channel and said first N-channel MOSFETs arranged at the outside ends of the series, associated clocks respectively coupled to the gate of said second P-channel MOSFET, and a second inverter coupling said clock to the gate of said second P-channel MOSFET and to the gate of said second N-channel MOSFET, with the output of said first logic gate taken from the junction between said second N-channel MOSFET and said second P-channel MOSFET; and said second logic gate comprises: third and fourth P-channel MOSFETs connected in series and third and fourth N-channel MOSFETs connected in series with said fourth P-channel and fourth N-channel MOSFETs also connected in series, the input of said second logic gate with coupled to the gates of said third P-channel and said third N-channel MOSFETs arranged at the outside ends of the series, associated clocks respectively coupled to the gate of said fourth P-channel MOSFET and to the gate of said fourth N-channel MOSFET through said second inverter, with the output of said second logic gate taken from the junction between said fourth P-channel MOSFET and said fourth N-channel MOSFET.

4. An asynchronous signal synchronizing circuit according to claim 3, wherein the gate width of the third P-channel MOSFET of said second logic gate of said first latch circuit and the third N-channel MOSFET of said second logic gate of said second latch circuit are made greater than the other MOSFET used in said latch circuits, respectively.

5. An asynchronous signal synchronizing circuit according to claim 1, wherein said second clock signal is shifted in phase by 90° from said first clock signal.

6. An asynchronous signal synchronizing circuit according to claim 5, wherein said means for generating said first and second clock signals whose phase is shifted by 90° comprises a clock with a frequency twice that of said first and second clock signals and means to divide said clock signal by 2.

7. An asynchronous signal synchronizing circuit comprising:

means for generating first and second clock signals of equal frequency but shifted in phase as well as third and fourth clock signals of equal frequency but shifted in phase, such that said third clock signal has a frequency substantially equal to that of said first clock signal as well as a phase substantially opposite to that of said first clock signal, said fourth clock signal has a frequency substantially equal to that of said second clock signal as well as a phase substantially opposite to that of said second clock signal;

a first latch circuit having as an input an asynchronous signal to be synchronized, means for transmitting said asynchronous signal from said input to an output of said first latch circuit in response to either a high level or a low level of said first clock signal and means for latching said output of said first latch circuit in response to either of said high level or said low level of said first clock signal;

a second latch circuit having said output signal of said first latch circuit as an input, means for transmitting said output signal of said first latch circuit from said input to an output of said second latch circuit in response to either a high level or a low level of said second clock signal, and means for latching said output of said second latch circuit in response to either said high level or said low level of said second clock signal;

a third latch circuit having said output signal of said second latch circuit as an input, means for transmitting said output signal of said second latch circuit from said input to an output of said third latch circuit in response to either a high level or a low level of said clock signal, and means for latching said output of said third latch circuit in response to either said high level or said low level of said third clock signal; and a fourth latch circuit having said output signal of said third latch circuit as an input, means for transmitting said output signal of said third latch circuit from said input to an output of said fourth latch circuit in response to either a high level or a low level of said fourth clock signal, and means for latching said output of said fourth latch circuit in response to either said high level or said low level of said fourth clock signal;

each of said first and second latch circuits including logic gates, arranged such that the latch output is fed back and held when its associated clock input in negated, the logic threshold values of the logic gates in said first and second latch circuits shifted such that the value output by said first latch circuit when an intermediate value is latched differs from the value required for said second latch circuit to latch an intermediate value.

* * * * *

UNITED STATES PATENT AND TRADEMARK OFFICE
CERTIFICATE OF CORRECTION

PATENT NO. : 4,745,302
DATED : May 17, 1988
INVENTOR(S) : Makoto HANAWA, et al.

It is certified that error appears in the above-identified patent and that said Letters Patent is hereby corrected as shown below:

| Column | Line | |
|---|---|---|
| Abstract | 2 | Delete "and" and insert --an--. |
| 1 | 14 | Delete "though" and insert --through--. |
| 2 | 12 | Delete "inherent" and insert --inherently--. |
| 6 | 21 | Delete "comprise" and insert --comprises--. |
| 6 | 43 | Delete "with". |
| 8 | 23 | Delete "in" and insert --is--. |

Signed and Sealed this

Twenty-seventh Day of September, 1988

Attest:

DONALD J. QUIGG

*Attesting Officer*            *Commissioner of Patents and Trademarks*